United States Patent
Boerner et al.

(10) Patent No.: US 10,217,966 B2
(45) Date of Patent: Feb. 26, 2019

(54) METHOD AND AN APPARATUS FOR AN ELECTROLUMINESCENT DEVICE WITH IMPROVED OUTCOUPLING

(71) Applicant: KONINKLIJKE PHILIPS N.V., Eindhoven (NL)

(72) Inventors: Herbert Friedrich Boerner, Aachen (DE); Dietrich Bertram, Aachen (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 49 days.

(21) Appl. No.: 15/464,764

(22) Filed: Mar. 21, 2017

(65) Prior Publication Data

US 2017/0194603 A1   Jul. 6, 2017

Related U.S. Application Data

(63) Continuation of application No. 13/319,110, filed as application No. PCT/IB2010/051896 on Apr. 30, 2010, now Pat. No. 9,647,239.

(30) Foreign Application Priority Data

May 8, 2009 (EP) .................................... 09159731

(51) Int. Cl.
*H01L 51/52* (2006.01)
*H01L 51/56* (2006.01)

(52) U.S. Cl.
CPC ...... *H01L 51/5271* (2013.01); *H01L 51/5221* (2013.01); *H01L 51/5253* (2013.01); *H01L 51/56* (2013.01); *H01L 2251/301* (2013.01); *H01L 2251/5361* (2013.01); *H01L 2251/5392* (2013.01)

(58) Field of Classification Search
None
See application file for complete search history.

(56) References Cited

U.S. PATENT DOCUMENTS

| | | |
|---|---|---|
| 5,910,706 A | 6/1999 | Stevens |
| 6,841,802 B2 | 1/2005 | Yoo |
| 8,179,036 B2 | 5/2012 | Eser et al. |
| 2003/0057417 A1 | 3/2003 | Lee et al. |
| 2004/0119403 A1 | 6/2004 | McCormick et al. |
| 2004/0188690 A1 | 9/2004 | Noguchi |

(Continued)

FOREIGN PATENT DOCUMENTS

| | | |
|---|---|---|
| CN | 1508765 A | 6/2004 |
| EP | 1670065 A1 | 6/2006 |

(Continued)

*Primary Examiner* — Laura M Menz
*Assistant Examiner* — Candice Chan

(57) ABSTRACT

The invention relates to an electroluminescent device (10) comprising a layer system with a substrate (40) and on top of the substrate (40) a substrate electrode (20), a counter electrode (30) and an electroluminescent layer stack with at least one organic electroluminescent layer (50) arranged between the substrate electrode (20) and the counter electrode (30), characterized in that at least one optical transparent outcoupling body (71) is provided on top of the substrate electrode (20) to increase the outcoupling of light generated by the at least one organic electroluminescent layer (50) at least partly covering the optical transparent outcoupling body (71). The invention further relates to a method to manufacture such a device.

16 Claims, 5 Drawing Sheets

(56) References Cited

U.S. PATENT DOCUMENTS

2008/0122347 A1    5/2008  Lee
2008/0186585 A1    8/2008  Mino et al.

FOREIGN PATENT DOCUMENTS

| | | |
|---|---|---|
| EP | 1684550 A1 | 7/2006 |
| EP | 1734792 A1 | 12/2006 |
| EP | 1763081 A2 | 3/2007 |
| JP | 2000036391 A | 2/2000 |
| JP | 2002110361 A | 4/2002 |
| JP | 200331355 A | 1/2003 |
| JP | 2003257663 A | 9/2003 |
| JP | 2009010356 A | 1/2009 |
| WO | 2007112038 A2 | 10/2007 |

METHOD AND AN APPARATUS FOR AN ELECTROLUMINESCENT DEVICE WITH IMPROVED OUTCOUPLING

CROSS-REFERENCE TO PRIOR APPLICATIONS

This application a continuation of U.S. patent application Ser. No. 13/319,110, filed on Nov. 7, 2011, which is U.S. National Phase application under 35 U.S.C. § 371 of International Application No. PCT/IB2010/051896, filed on Apr. 30, 2010, which claims the benefit of EP Patent Application No. EP 09159731.0, filed on May 8, 2009. These applications are hereby incorporated by reference herein.

FIELD OF THE INVENTION

The present invention relates to an electroluminescent device comprising a layer system with a substrate and on top of the substrate a substrate electrode, a counter electrode and an electroluminescent layer stack with at least one organic electroluminescent layer arranged between the substrate electrode and the counter electrode with increased outcoupling of light. Furthermore, the invention relates to a method for manufacturing an electroluminescent device with an increased outcoupling of light.

BACKGROUND OF THE INVENTION

A typical organic light emitting device (OLED) comprises a glass substrate, a transparent substrate electrode, e.g. Indium-Tin-Oxide (ITO), an electroluminescent layer stack and a reflective counter electrode. Light generated from the device is emitted through the glass substrate. The indices of refraction of the substrate electrode, the electroluminescent layer stack and of glass are typically 1.9 to 2.0, 1.7 to 1.9, and about 1.5, respectively.

Due to the differences between the refractive indices of the substrate, the layers and the environment, usually air, most of the light generated in the OLED is not able to escape from the substrate to the outside. Typically, the generated light is divided into the following fractions: 30% of the light is trapped in the light guide formed by the organic layers and the ITO, about 20% is lost in the interaction with the metal-cathode, about 50% enters the glass substrate and from the glass substrate only 20% can escape to the outside. According to the prior art, different means for an improved light outcoupling are already known, e.g. layers with light scattering properties, but unfortunately leading to different disadvantages.

As an example, EP 1 734 792 A1 discloses an electroluminescent device comprising a reflective electrode with light-scattering and light-reflecting properties. Unfortunately, said structuring of the substrate electrode is limited within the nm-range and is limited to only a low improvement of said light outcoupling.

EP 1 763 081 A2 discloses an OLED with a substrate featuring a number of recesses, in which a non-transparent reflective material is buried in, in order to reflect light captured within the substrate to the substrate surface with another propagation direction to couple out the light to the environment. Unfortunately, the manufacturing of a substrate comprising recesses in order to embed in said non-transparent reflective material is complex and costly. Moreover, the amount of emitted light, captured within the layers on top of the substrate will not be coupled out with this measure.

SUMMARY OF THE INVENTION

Thus, the invention has for its object to eliminate the disadvantages mentioned above. In particular, it is an object of the invention to disclose an electroluminescent device with an improved outcoupling of light. Moreover it is an object of the invention to disclose a simplified arrangement of light outcoupling means.

This object is achieved by an electroluminescent device comprising a layer system with a substrate and on top of the substrate a substrate electrode, a counter electrode and an electroluminescent layer stack with at least one organic electroluminescent layer arranged between the substrate electrode and the counter electrode, wherein at least one optical transparent outcoupling body is provided on top of the substrate electrode to increase the outcoupling of light generated by the organic electroluminescent layer at least partly covering the optical transparent outcoupling body. The object is also achieved by a method for manufacturing the electroluminescent device according to the present invention. Preferred embodiments of the electroluminescent device and the method are defined in the subclaims. Features and details described with respect to the electroluminescent device also apply to the method and vice versa.

The present invention discloses at least one optical transparent outcoupling body provided on top of the substrate electrode to increase the outcoupling of light generated by the at least one organic electroluminescent layer at least partly covering the optical transparent outcoupling body. The optical transparent outcoupling body may be attached to the substrate electrode via thin adhesive means such as glue not disturbing the optical properties of the outcoupling body and the substrate electrode. The optical transparent body may be a macroscopic rigid body. The optical transparent body may be preformed before applying the body to the substrate electrode comprising a transparent material, e.g. glass or plastic.

The leading idea of the present invention is to use at least one optical transparent outcoupling body, which is provided on top of the substrate electrode. Thus, the optical outcoupling body is arranged between the substrate electrode and the electroluminescent layer stack comprising said at least one organic electroluminescent layer. This arrangement allows the simply use of ITO-coated substrates, whereas the ITO-coating forms the substrate electrode, deposited on a substrate forming the carrier material. Said ITO-coated substrates are provided as standard substrates for electroluminescent devices, and are indicated by a high availability and low costs.

Subsequently, the electroluminescent layer stack comprising at least one organic electroluminescent layer and said counter electrode is applied on the optical transparent outcoupling body or on the outcoupling bodies and also on the part of the substrate electrode surface, which is not covered with said optical transparent outcoupling bodies.

When a voltage is applied between the substrate electrode and the counter electrode, current is injected from the electrodes and said electroluminescent layer stack is excited to emit light in the area, where the electroluminescent layer stack is directly deposited on the surface of the substrate electrode. As a result, the optical transparent outcoupling body forms an isolation body, preventing a current injection in the electroluminescent layer stack.

Combined with the advantage of an easy application of the at least one optical transparent outcoupling body, the emergence of a local enhancement of the electrical field in the area of sharp edges of the arranged optical transparent outcoupling body is avoided. Due to the non-conductive behavior of said optical transparent outcoupling body, the local enhancement of the electrical field is avoided, when a voltage is applied between the substrate electrode and the counter electrode.

In one embodiment the optical transparent outcoupling body features a high index of refraction and preferably at least matching the index of refraction of the substrate in order to avoid a reflective index transition between the optical transparent outcoupling body and the substrate leading to outcoupling losses. Typical values for the refractive indices of the glass substrate are 1.51 to 1.54, for the substrate electrode 1.9 to 2.0 and for the outcoupling body 1.5 to 1.6.

According to another preferred embodiment of the present invention, the optical transparent outcoupling body is glued on top of the substrate electrode. By the use of glue for applying said optical transparent outcoupling body on top of the substrate electrode, a simple and easy manufacturing process is provided by using glue.

Yet another embodiment of the present invention provides glue for arranging said optical transparent outcoupling body on top of the substrate electrode, which features a high optical transparency. Thus, the glue for gluing the optical transparent outcoupling body on top of the substrate electrode forms optical transparent glue, featuring a high index of refraction, whereas said index of refraction is at least equal to the index of refraction of the substrate material, but equal to or less than the refractive index of the optical transparent outcoupling body. Thus, the optical transition between the optical transparent glue and the optical transparent outcoupling body is optimized and the light in the substrate material can pass into the optical transparent outcoupling body via the optical transparent glue.

There are two embodiments concerning the surface of the outcoupling bodies facing towards the counter electrode: In one embodiment, the surface is transparent, such that light entering from the substrate electrode side into the outcoupling body can exit towards the counter electrode, where the light is reflected. In this embodiment, the light has to pass twice trough the organic electroluminescent layer stack in front of the counter electrode. In this case, the reflectivity is determined by the absorption in the organic layers and the counter electrode.

In another embodiment the surface of the optical transparent outcoupling body facing towards the electroluminescent layer stack and/or the counter electrode is covered with a reflective means, preferably with Silver, Aluminum, a dielectric mirror or a combination of these. People skilled in the art may consider other suitable reflective materials within the scope of this invention. The covered surfaces act as a mirror reflecting the light towards the substrate for passing the substrate and or coupling out via the substrate into the environment. In this embodiment, the light is reflected directly at the rear surface of the outcoupling body without passing through the organic electroluminescent stack in front of the counter electrode. This has the advantage, that losses due to absorption can be minimized.

The reflective principle is suited due to the 3-dimensional form of the outcoupling bodies. The improvement of optical outcoupling of the light waveguided within the substrate material is based on the change of direction of the light rays due to the reflection at the rear sides of the outcoupling body facing towards the counter electrode or at the counter electrode itself. The top angle of the prismatic outcoupling body has to be chosen such that light rays that are initially totally reflected at the substrate/air interface are redirected towards this substrate/air interface under angles that allow the escape into air.

In the context of the invention the notion electroluminescent (EL) layer stack denotes all layers prepared between the substrate and counter electrodes. In one embodiment of an EL layer stack, it comprises at last one light emitting organic electroluminescent layer prepared between the substrate and the counter electrode. In other embodiments the layer stacks may comprise several layers prepared between the substrate and the counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and or the counter electrode comprise at least one of the following materials: ITO, aluminum, silver, doped ZnO or an oxide layer.

In the context of the invention the notion substrate denotes a base material onto which the different layers of an electroluminescent device are deposited. Normally, the substrate is transparent and is made of glass. Furthermore, it may be preferable that the substrate is transparent, preferably comprising at least one of the following materials: silver, gold, glasses or ceramics. It may also be a transparent polymer sheets or foils with a suitable moisture and oxygen barrier to essentially prevent moisture and/or oxygen entering the electroluminescent device layer stack. It is also possible to use non-transparent materials like metal foils as substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin Oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers, typically with a thickness of about 8 nm to 15 nm, are used single or in combination with ITO as the substrate electrode. If a metal foil is used as the substrate, it takes also the role of the substrate electrode, either anode or cathode. The notation on-top-of denoted the sequence of the listed layers. This notation explicitly comprises the possibility of further layers in between the layer denoted as on top of each other. For example, there might be additional optical layers to enhance the light out-coupling arranged between substrate electrode and substrate.

In the context of the invention the notion counter electrode denotes an electrode away from the substrate. It is usually non-transparent and made of Al or Ag layers of sufficient thickness such that the electrode is reflecting, the thickness amounts typically 100 nm for Al and 100 nm to 200 nm for Ag. It is usually the cathode, but it can also be biased as the anode. For top-emitting or transparent electroluminescent devices the counter electrode has to be transparent. Transparent counter electrodes are made of thin Ag or Al layers with a thickness of about 5 nm to 15 nm or of ITO layers deposited on top of the other previously deposited layers.

In the context of the invention an electroluminescent device with a combination of a transparent substrate, a transparent substrate electrode and a non-transparent counter electrode, which is usually reflective, emitting the light through the substrate is called "bottom-emitting". In case of electroluminescent device comprising further electrodes, in certain embodiments both substrate and counter electrodes could be either both anodes or both cathodes, when the inner electrodes are driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting. In the context of the invention a layer, substrate or electrode is called transparent if the transmission of light in the visible range is more than 50%; the rest being absorbed or reflected. Furthermore, in the context of the invention a layer, substrate or electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, connector or construction element of an electroluminescent device is called electrically conducting if its electrical resistance is less than 100000 Ohm. In the context of the invention passive electronic components comprise resistors, capacitors and inductivities. Furthermore, in the context of the invention active electronic components comprise diodes, transistors and all types of integrated circuits.

In the context of the invention a layer, substrate, electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, substrate, electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

In a preferred embodiment the glue is anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the conductive glue itself but also on the amount of water, which can be absorbed by the organic electroluminescent layer without damaging it.

In a further preferred embodiment the electroluminescent device may comprise moisture and/or oxygen barriers. In the context of the invention layers prevention harmful diffusion of moisture and/or oxygen into the layer stack are called moisture and/or oxygen barriers. Diffusion is denoted as harmful if a significant life-time reduction of the emitted light can be observed. Standard OLED devices according to state of the art achieve shelf life times in the order of 100.000 hours or more. A significant reduction denotes a reduced life-time of about a factor of 2 or more.

The optical transparent outcoupling bodies may be made of glass, plastics or any other optically transparent materials and may feature a longitudinal extension with a cross section, which can be triangular, prismatic, parabolic, semi-circular or e.g. elliptic, whereas the optical transparent outcoupling body preferably is manufactured by an injection molding process. The outcoupling body forms a smooth, even transition from the surface of the substrate electrode to the upper side of the outcoupling body, aided by the glue used for attaching the outcoupling elements to the substrate electrode.

In its preferred embodiment, a plurality of optical transparent outcoupling bodies is arranged on top of the substrate electrode with intermediate spaces between the optical transparent outcoupling bodies forming a grid structure, which is preferably performed as a rectangular grid, a hexagonal grid or an irregular grid. In the preferred embodiment, the outcoupling bodies form a symmetrical array, whereas the array preferably is a hexagonal array. The arrangement of said outcoupling bodies may be extended across the entire emitting field of the electroluminescent device.

Advantageously, the optical transparent outcoupling body combined with the glue for gluing the outcoupling bodies on the surface of the substrate electrode and in particular the grid, formed of a plurality of outcoupling bodies, forms a protective means. In another preferred embodiment, the glue features electrically non-conductive glue.

In a preferred embodiment the glue at least partly covers the surface of the optical transparent outcoupling body facing towards the electroluminescent layer stack to prevent an emergence of a shadowing edge on the substrate electrode. This provides contiguous layers on top of the optical transparent outcoupling bodies avoiding the risk of shorts due to layer defects around the optical transparent outcoupling bodies. Furthermore a smooth structure prevents any enhancement of the electrical field, when voltage is applied between said two electrodes.

According to another embodiment the electroluminescent device comprises at least one electrical contact means on top of at least one optical transparent outcoupling body for electrically contacting the counter electrode to an electrical power source, whereas the electrical non-conductive protective means is arranged at least fully covering the area below the contact means. Said electrical contact means preferably features electrical conductive glue. This leads to the advantage that a three-dimensional contact schema with a minimum risk of shorts is provided. The contact means has to be applied fully above the optical transparent outcoupling body in order to avoid any risk of shorts between the counter and substrate electrodes.

Usually, conductive glue consists of organic glue with conductive filler in the form of conductive flakes or particles. During the setting of the glue, the glue may display certain shrinkage, which forces some of the filler particles into the underlying layers, creating shorts between the substrate electrode and the counter electrode. To prevent this, it is advantageous to use a protective means that is non-conductive and is between the substrate electrode and the counter electrode.

Therefore, all known conductive glues can be used for contacting the counter electrode to an electrical source. The protective means has to cover the full area where the contact means is applied to the counter electrode, since this might be the source of shorts, but it could also be larger than the area of the contact means. To prevent a direct contact between the counter electrode and the substrate electrode, it is preferable that the protective means has a thickness and/or a hardness, which assures that the contact means cannot get into electrical contact with the substrate electrode. To achieve this object, in a preferred embodiment the protective means may comprise a non-conductive glue and the non-conductive, transparent optical outcoupling body. Usually, the optical outcoupling body is thick and hard enough to achieve the desired protection. People skilled in the art may choose other electrical non-conductive materials within the scope of the present invention.

A further advantage achieved by the usage of conductive glue as a contact means is, that a substrate with only one contiguous electrode can be used, which serves as a substrate electrode for the electroluminescent device. In known OLEDs, the electrode on the substrate is at least structured into two electrical separate regions: one serving as the substrate electrode and the other one connected to the counter electrode. Thus, both the substrate and the counter electrode are led in one plane to the rim of the substrate, where they can be contacted by standard means. The disadvantage of this 2-dimensional contacting scheme is that the substrate electrode as well as the counter electrode have to share the periphery of the OLED for contacting, so that the electrode on the substrate needs to be divided into at least two disjoint regions, namely the substrate electrode and a second electrode to be contacted with the counter electrode, to avoid shorting the device. The disclosed 3-dimensional contacting eliminates this serious disadvantage of the 2-dimensional contacting.

To prevent a direct contact between the counter electrode and the substrate electrode, it is preferable that the protective means has a thickness and/or a hardness, which assures that the contact means cannot get into electrical contact with the substrate electrode. To achieve this object, in a preferred embodiment the protective means may comprise non-conductive glue and the non-conductive, transparent optical outcoupling body. Usually, the optical outcoupling body is thick and hard enough to achieve the desired protection. People skilled in the art may choose other electrical non-conductive materials within the scope of the present invention.

The electroluminescent device comprises an encapsulation means, which is arranged for encapsulating at least said electroluminescent layer stack, whereas the electrical contact means is preferably arranged in between said encapsulation means and the counter electrode for electrically contacting the counter electrode to the encapsulation means. The encapsulation means may also encapsulate the whole stack of layers of the electroluminescent device or just a plurality of layers, forming a part of the whole stack of layers. Preferably, the encapsulation means is provided as a gas-tight element, covering at least the organic electroluminescent layer and the counter electrode. By using a gas-tight encapsulation means, it is prevented that environmental factors like water or oxygen damage the encapsulated layers. The encapsulation means may form a gas-tight lid. This lid may be formed of glass or metal. It is also possible to form the encapsulation means by one or a plurality of layers supplied to the electroluminescent device or just parts of it. The layers may comprise silicone, silicone oxide, silicone nitride, aluminum oxide or silicone oxynitride. All the named encapsulation means prevent mechanical and/or environmental factors from affecting the layer stack of the electroluminescent device adversely. As an example, the encapsulation means can be made of metals, glasses, ceramics or combinations of these. It is attached to the substrate by conductive or non-conductive glue, melted glass frit or metal solder. Therefore, it may also provide mechanical stability for the electroluminescent device, whereas at least parts of the applied glue between the layers and the encapsulation means is electrical conducting for contacting the counter electrode.

According to yet another embodiment of the present invention comprises at least one electrical shunt means, which can be applied to the substrate electrode to minimize the voltage drops within the lateral extension of the substrate electrode, wherein the electrical shunt means is arranged on the surface of the substrate electrode and whereas said outcoupling body covers the electrical shunt means in a way, that the electrical shunt means is arranged between said substrate electrode and said optical outcoupling body. Thus, the optical outcoupling body can be glued to the substrate electrode by optical transparent glue as described above, featuring a high index of refraction. The electrical shunt means can be at least one element of a group of a wire, a metallic stripe or a metallic foil. Furthermore said electrical shunt means is fixed to the substrate electrode by electrically conductive glue, limited to parts of the area of the electrical shunt means.

Preferably, the electrical shunt means is electrically connected at least at the end points and maybe at some points in the middle. As a result, a glue-in-glue-arrangement can be applied for electrically contacting the electrical shunt means to the substrate electrode by the use of electrically conductive glue, but the remaining area between the optical outcoupling body and the substrate electrode is filled with electrical non-conductive glue featuring a high index of refraction and transparency. In order to arrange said electrical shunt means in a sandwich-like manner between the optical outcoupling body and the surface of the substrate electrode, said optical outcoupling body may have a kind of recess in the bottom surface for receiving said wire, metallic stripe or foil.

The present invention is also directed to a method for manufacturing an electroluminescent device with an increased outcoupling of light, whereas the method comprises at least the steps of providing at least one optical transparent outcoupling body on top of the substrate electrode and a subsequent application of the electroluminescent layer stack and the counter electrode both on the optical transparent outcoupling body and on the surface of the substrate electrode. Moreover, the method is embodied in at least one optical transparent outcoupling body, which is glued on top of the substrate electrode by transparent glue. Advantageously the glue is applied at least partly on top of the surface of the optical transparent outcoupling body facing towards the electroluminescent layer stack to prevent an emergence of a shadowing edge on the substrate electrode.

In the preferred embodiment, the glue is applied at least partly on top of the surface of the optical transparent outcoupling body facing towards the electroluminescent layer stack to prevent an emergence of a shadowing edge on the substrate. The application of the glue, preferably of the non-conductive glue, forms a smooth and flat transition between the surface of the substrate electrode and the upper sides of the outcoupling body. The application of the glue leads to an improved deposition process of said layers on top of the substrate electrode with a smooth transition into the surface of the outcoupling body, where contiguous layers of the electroluminescent layer stack and the counter electrode can be prepared. In contrast to that, shadowing edges would lead to a lesser amount of material or no amount of material deposited around the shadowing edges. By applying the method according to the invention using non-conductive glue, a local enhancement of the electrical fields in the area of the outcoupling body can be avoided.

The aforementioned electroluminescent device and/or the method, as well as claimed components and the components to be used in accordance with the invention in the described embodiments are not subject to any special exceptions with respect to size, shape or the material selection. Technical concepts such as the selection criteria are known in the pertinent field can be applied without limitations. Additional details, characteristics and advantages of the object of the present invention are disclosed in the subclaims and the following description of the respective figures, which are an exemplary fashion only, showing a plurality of preferred embodiments of the electroluminescent device according to the present invention.

BRIEF DESCRIPTION OF THE DRAWINGS

Further embodiments of the invention will be described with respect to the following figures, which show.

DETAILED DESCRIPTION OF THE EMBODIMENTS

Figure 1:
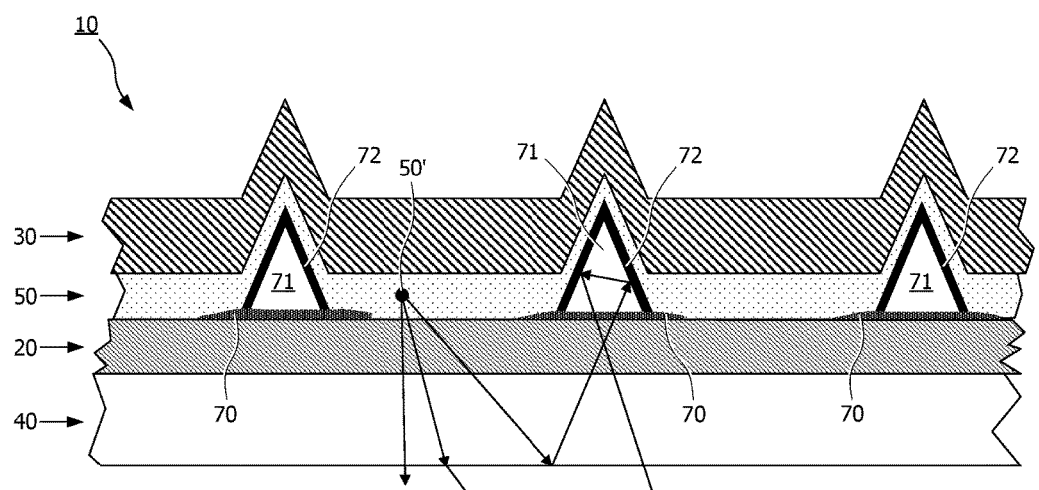
FIG. 1 an embodiment of an electroluminescent device according to the invention with outcoupling bodies applied on the substrate electrode with a first reflection principle, FIG. 2 an embodiment of an electroluminescent device with outcoupling bodies applied on the substrate electrode with a second reflection principle, FIG. 3 an embodiment of an electroluminescent device with outcoupling bodies and with electrical shunt means, FIG. 4 an embodiment of an electroluminescent device with an outcoupling body and an electrical contact means for electrical contacting the counter electrode, shown in a detailed cross section and FIG. 5 a side view and a cross sectional view of an embodiment of the electroluminescent device comprising an optical outcoupling body and a shunt means.

In FIG. 1 an electroluminescent device 10 according to an embodiment of the invention is shown. The electroluminescent device 10 comprises a substrate electrode 20, a counter electrode 30 and an organic electroluminescent layer 50 representing the electroluminescent layer stack in this and the following embodiments. The organic electroluminescent layer 50 is arranged between the substrate electrode 20 and the counter electrode 30 forming said layer stack. These layers are arranged on a substrate 40, forming the carrier material of the electroluminescent device 10. In the shown embodiment the substrate electrode 20 is formed by an approximately 100 nm thick layer of ITO, which is a transparent and conductive material. Onto this substrate electrode 20 the organic electroluminescent layer 50 is deposited. If a voltage is applied between the substrate electrode 20 and the counter electrode 30 some of the organic molecules within the organic electroluminescent layer 50 are exited, resulting in the emission of artificial light, which is emitted by the electroluminescent layer 50. The counter electrode 30 is formed by a layer of aluminum, working as a mirror reflecting the artificial light through the substrate electrode 20 and the substrate 40. To emit light into the surrounding the substrate 40 in this embodiment is made of glass. Thus, the electroluminescent device 10 is a bottom emitting OLED. The electroluminescent device 10 shown in the following figures as well as the components and the components used in accordance with the invention are not shown true to their scale. Especially the thickness of the electrodes 20 and 30, the organic electroluminescent layer 50 and the substrate 40 are representing a not true scale. All figures just serve to clarify the invention.

As shown in detail, the electroluminescent device 10 comprises optical transparent outcoupling bodies 71. The optical transparent outcoupling bodies 71 have a specific spatial geometry, a triangular or prismatic shape, representing only one embodiment of a plurality of different possible shapes. The optical transparent outcoupling bodies 71 lead to an improved outcoupling of light, generated by the organic electroluminescent layer 50, exemplarily shown by an organic electroluminescent point 50'. The optical transparent outcoupling bodies 71 are made of an optical transparent material having an index of refraction, which is nearly equal to or higher than the index of refraction of the substrate 40 of the electroluminescent device 10. The light, emitted by the organic electroluminescent point 50' entering the optical outcoupling body 71, is reflected at the upper side of the outcoupling body 71 towards the substrate electrode 20 again. The reflected light now has a direction, which allows it to pass the bottom surface of the substrate 40. By means of said outcoupling bodies 71 the portion of light emitted by the electroluminescent device 10 is thus increased. In order to ensure the reflection of light in the upper surface of the optical outcoupling bodies 71, the optical outcoupling bodies 71 feature reflective means 72.

As shown in the depiction, the organic electroluminescent layer 50, representing the electroluminescent layer stack and the counter electrode 30 is applied on the surface of the substrate electrode 20 as well as on the upper side of the optical transparent outcoupling bodies 71. The application of the organic electroluminescent layer 50 and the counter electrode 30 on top of said surfaces is based on a vacuum deposition process as known to a person skilled in the art. The glue 70 prevents a current flow between the substrate electrode 20 and the reflective means 72, which can be formed by metallic cover elements or a surface layer, each may feature electrical conductivity.

Figure 2:
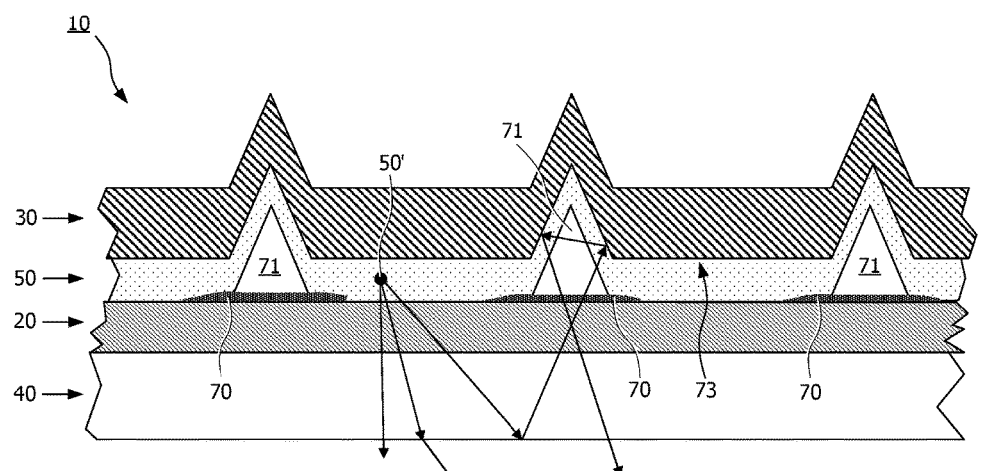

FIG. 2 shows the embodiment where the reflection of light entering the optical outcoupling bodies 71 happens on the counter electrode 30 behind the outcoupling bodies. The light enters into the optical outcoupling bodies 71 and leaves the optical outcoupling bodies 71 at the upper side again, propagating towards the counter electrode 30 for reflecting on the inner reflective surface 73 of the counter electrode 30. As shown, the optical outcoupling bodies 71 are attached to the substrate electrode 20 by the use of transparent glue 70. The glue 70 covers the surface of the substrate electrode 20 below the arrangement of the outcoupling body 71 and extends into the neighboring areas of the outcoupling bodies 71. The presence of glue 70 in the transition region between the substrate surface and the upper side of the outcoupling bodies 71 leads to a flat, smooth transition between the outcoupling body and the substrate electrode. Due to the presence of said glue the shadowing effect is avoided, and the deposition of the layer system comprising at least the organic electroluminescent layer 50 and the counter electrode 30, respectively, can be performed with an improved reliability.

Figure 3:
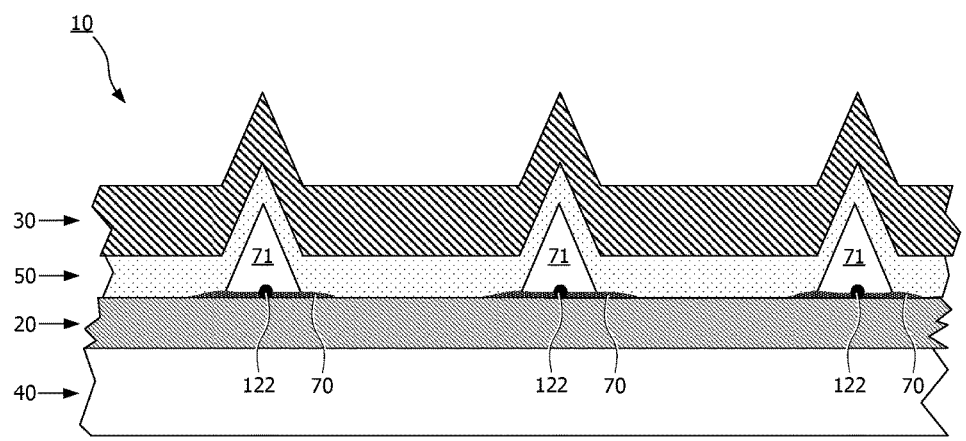

FIG. 3 shows another embodiment of the electroluminescent device 10 according to the present invention illustrating optical outcoupling bodies 71, whereas the optical outcoupling bodies 71 cover electrical shunt means 122, applied on the surface of the substrate electrode 20. Thus, this arrangement of electrical shunt means 122 is performed sandwich-like in between said substrate electrode 20 and said optical outcoupling bodies 71. Moreover, the optical outcoupling bodies 71 combined with electrical non-conductive glue 70 forms a protective means 70, preventing shorts between the electrical shunt means 122 and the counter electrode 30.

Figure 4:
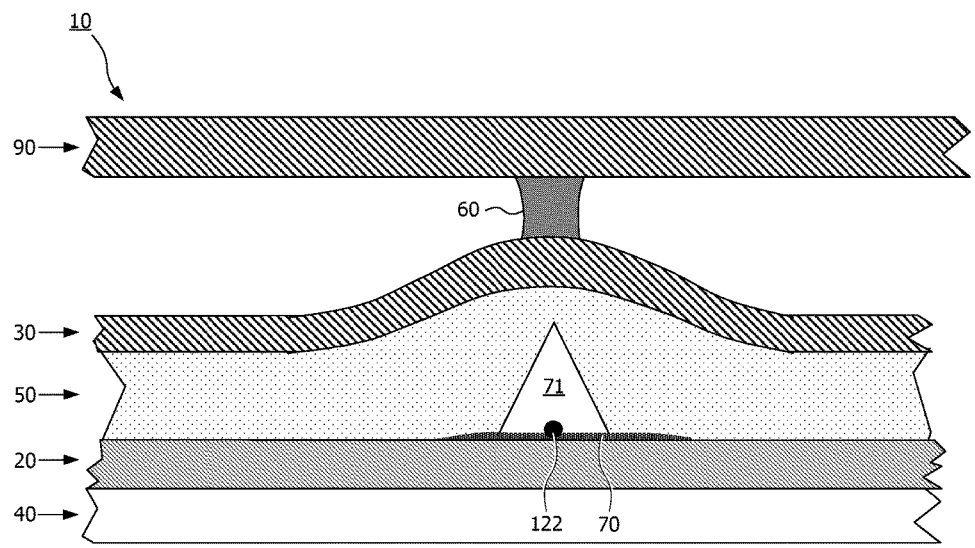

FIG. 4 shows the arrangement of an electroluminescent device 10 comprising a contact means 60. The electroluminescent device 10 may comprise at least one or a plurality of the depicted contact means 60, arranged for electrically contacting the counter electrode 30 to an electrical power source. The contact means 60 is therefore part of the path leading from the counter electrode 30 to the electrical source. In the prior art contact posts are used as contact means 60, which are applied to the counter electrode 30. Such contact posts have the disadvantage that they are mechanically applied to the counter electrode 30 and often lead to shorts between the counter electrode 30 and the substrate electrode 20. To overcome this disadvantage, the invention discloses that the contact means 60 is conductive glue, applied to the counter electrode 30.

The contact means 60 can be formed by electrical conductive glue, arranged in direct electrical contact with the counter electrode 30 as well as the shown encapsulation means 90. Therefore, it is easy to electrically connect the counter electrode 30 to an electrical power source via said encapsulation means 90. The user just has to apply an electrical conductive means to the encapsulation means 90. The conductive glue between the encapsulation means 90 and the counter electrode 30 then leads the electrical current to the counter electrode 30.

When conductive glue is used to form the electrical contact means 60, a preferred embodiment of the disclosed electroluminescent device 10 comprises a protective means 70, which is formed by the glue 70 and the optical transparent outcoupling body 71. As shown, the electrical non-conductive protective means 70 is arranged at least fully covering the area below the contact means 60. The protective means 70 is arranged on the substrate electrode 20, and an electrical shunt means 122 is arranged sandwich-like between the protective means 70, embodied as the optical transparent outcoupling body 71 and the surface of the substrate electrode 20 for shunting the substrate electrode 20. This arrangement protects the area below the contact means 60 and can also form an optical outcoupling system as well as a shunting system. Thus, this arrangement using the protective means 70 satisfying three objectives, namely fully covering the shunt means 122 and fully covering the area below the electrical contact means 60, requiring electrical non-conductive glue forming the protective means 70. Furthermore, the optical outcoupling of the light emitted by the organic electroluminescent layer 50 is improved.

Figure 5:
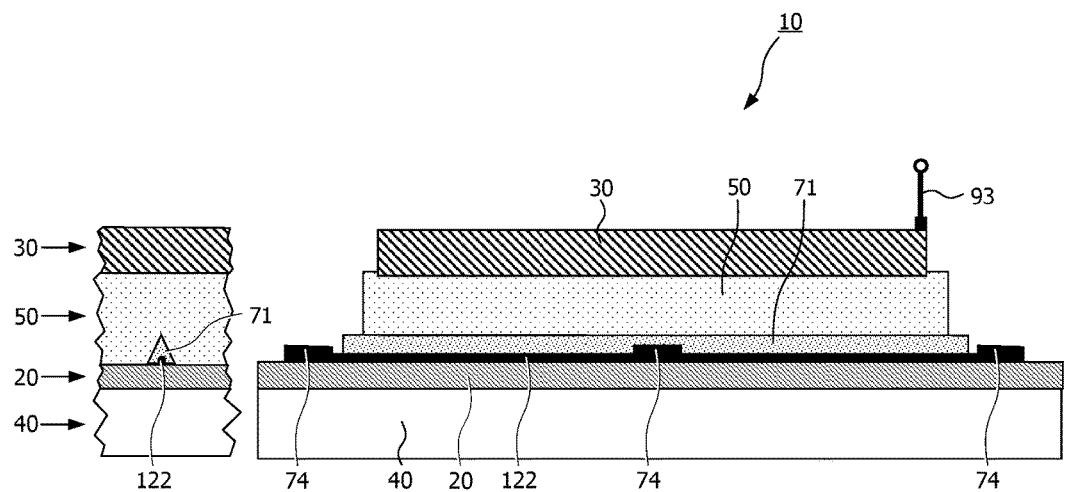

FIG. 5 shows another embodiment of the electroluminescent device 10 in a side view and a cross section. As shown, the electrical shunt means 122 can be lead out of the arrangement comprising the optical transparent outcoupling body 71 and the layer system comprising at least the organic electroluminescent layer 50 and the counter electrode 30. The electrical shunt means 122 is applied on the surface of the substrate electrode 20 and extends in lateral direction beside the arrangement of said layers and in particular the arrangement of the optical transparent outcoupling body 71.

The counter electrode 30 is contacted by the connection means 93, as shown only in exemplary fashion. The electrical shunt means 122 can be contacted to the substrate electrode 20 via contact means 74 at both ends and at a few points along its length, in order to equalize the voltage across the emitting field of the organic electroluminescent device 10. In particular, by applying the electrical shunt means 122, the electrical voltage at the centre of the electroluminescent device 10 is aligned to the electrical voltage in the outer regions of the emitting field of the electroluminescent device 10 during operation.

The described embodiments comprise as an example an organic electroluminescent layer 50 within the layer stack. In alternative embodiments within the scope of this invention, the electroluminescent layer stack may comprise layer additional to organic electroluminescent layer 50 such as hole transparent layers, hole blocking layers, electron transport layer, electron blocking layers, charge injection layers, further conducting layers, etc.

The invention claimed is:

1. An electroluminescent device comprising:
    a substrate;
    a substrate electrode disposed on the substrate;
    a counter electrode;
    at least one organic electroluminescent layer disposed between the substrate electrode and the counter electrode; and
    at least one optically transparent body disposed on the substrate electrode,
    wherein the optically transparent body is arranged to increase the outcoupling of light generated by the at least one organic electroluminescent layer,
    wherein the at least one organic electroluminescent layer covers at least a portion of the optically transparent body;
    wherein a first surface of the counter electrode that faces the substrate is covered with a reflecting material.

2. The electroluminescent device according to claim 1, wherein the reflecting material is selected from the group consisting of silver, aluminum, and a dielectric mirror.

3. The electroluminescent device according to claim 1, wherein the reflecting material comprises silver.

4. The electroluminescent device according to claim 1, wherein the optically transparent body comprises an index of refraction, the index of refraction at least matching the index of refraction of the substrate.

5. The electroluminescent device according to claim 1, wherein the optically transparent body comprises a longitudinal extension with a cross section,
    wherein the cross section is selected from the group consisting of rectangular, triangular, prismatic, parabolic, semi-circular and elliptic.

6. The electroluminescent device according to claim 1, wherein the reflecting material is disposed on a second surface of the optically transparent body, the second surface facing towards the organic electroluminescent layer.

7. The electroluminescent device according to claim 1, wherein the at least one optically transparent body is fastened to the substrate electrode by a glue.

8. The electroluminescent device according to claim 7, wherein the glue is transparent to the light emitted from the electroluminescent device,
    wherein the glue has an index of refraction,
    wherein the index of refraction at least matches the index of refraction of the substrate.

9. The electroluminescent device according to claim 7,
wherein the glue is electrically non-conductive,
wherein the glue is arranged to prevent electrical contact between the substrate electrode and the counter electrode.

10. The electroluminescent device according to claim 7,
wherein the optically transparent body has a third surface facing towards the organic electroluminescent layer,
wherein the glue at least partly covers the third surface,
wherein the glue is arranged to prevent an emergence of a shadowing edge on the substrate electrode.

11. The electroluminescent device according to claim 7,
wherein the electroluminescent device comprises at least one electrical contact on top of the at least one optically transparent body,
wherein the at least one electrical contact is arranged to electrically connect the counter electrode to an electrical power source.

12. The electroluminescent device according to claim 11,
wherein an encapsulation is arranged to encapsulate at least the at least one organic electroluminescent layer,
wherein the electrical contact is disposed between the encapsulation and the counter electrode,
wherein the counter electrode is arranged to electrically connect the counter electrode to the encapsulation.

13. The electroluminescent device according to claim 1,
wherein at least one electrical shunt is disposed on the substrate electrode,
wherein the substrate electrode is arranged to align an electrical potential within the lateral extension of the substrate electrode,
wherein the electrical shunt is disposed between the substrate electrode and the optically transparent body.

14. The electroluminescent device according to claim 1,
further comprising a plurality of optically transparent bodies,
wherein the plurality of optically transparent bodies are disposed on top of the substrate electrode,
wherein the plurality of optically transparent bodies are arranged with intermediate spaces between the plurality of optically transparent bodies.

15. The electroluminescent device according to claim 14,
wherein the plurality of optically transparent bodies form a grid structure.

16. An electroluminescent device, comprising:
a substrate;
a substrate electrode adjacent to the substrate;
a counter electrode; and
an at least one electroluminescent layer,
wherein the electroluminescent layer is disposed between the substrate electrode and the counter electrode,
wherein a surface of the counter electrode that faces the substrate is covered with a reflecting material,
wherein at least one optically transparent body is affixed to the substrate electrode by an electrically non-conductive glue,
wherein the at least one optically transparent body is arranged to increase the outcoupling of light generated by the at least one electroluminescent layer,
wherein the electroluminescent layer surrounds at least a portion of the at least one optically transparent body.

* * * * *